United States Patent
Luo et al.

(10) Patent No.: US 8,222,095 B2
(45) Date of Patent: Jul. 17, 2012

(54) METHOD FOR FABRICATING THIN FILM TRANSISTOR

(75) Inventors: Fang-Chen Luo, Hsinchu (TW); Shuo-Wei Liang, Taipei County (TW); Shin-Chuan Chiang, Taipei (TW); Chao-Nan Chen, Nantou County (TW); Chin-Chih Yu, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, New Taipei (TW); Chi Mei Optoelectronics Corporation, Tainan County (TW); Industrial Technology Research Institute, Hsinchu (TW)

( * ) Notice: Subject to any disclaimer, the term of this patent is extended or adjusted under 35 U.S.C. 154(b) by 933 days.

(21) Appl. No.: 12/258,451

(22) Filed: Oct. 27, 2008

(65) Prior Publication Data

US 2009/0305473 A1   Dec. 10, 2009

(30) Foreign Application Priority Data

Jun. 10, 2008 (TW) .............................. 97121565 A (51) Int. Cl.
*H01L 21/00* (2006.01)
(52) U.S. Cl. ................................. 438/158; 257/E21.411
(58) Field of Classification Search .................. 438/158; 257/E21.411
See application file for complete search history.

(56) References Cited

U.S. PATENT DOCUMENTS

| 5,530,265 | A  | * | 6/1996  | Takemura ...................... 257/66 |
| 6,107,640 | A  | * | 8/2000  | Park et al. ...................... 257/59 |
| 6,242,758 | B1 | * | 6/2001  | Yamazaki et al. .............. 257/59 |
| 6,921,951 | B2 | * | 7/2005  | Lai ................................ 257/401 |
| 7,064,346 | B2 |   | 6/2006  | Kawasaki et al. |
| 7,288,477 | B2 | * | 10/2007 | Choi et al. .................... 438/637 |

(Continued)

FOREIGN PATENT DOCUMENTS

CN            1941299         4/2007

OTHER PUBLICATIONS

"Second Office Action of China Counterpart Application", issued on Nov. 24, 2010, p1-p5, in which the listed reference was cited.

(Continued)

*Primary Examiner* — Lex Malsawma
(74) *Attorney, Agent, or Firm* — Jianq Chyun IP Office (57) ABSTRACT

A method for fabricating a thin film transistor is provided. A gate is formed on a substrate. A gate insulating layer is formed on the substrate to cover the gate. A metal oxide material layer is formed on the gate insulating layer. A photoresist layer is formed on the metal oxide material layer, in which a thickness of the photoresist layer above the gate is larger than that of the photoresist layer above two sides adjacent to the gate. A portion of the metal oxide material layer is removed to form a metal oxide active layer by using the photoresist layer as a mask. The photoresist layer above the two sides adjacent to the gate is removed and the remaining photoresist layer covers a portion of the metal oxide active layer. A source and a drain are formed on the metal oxide active layer covered by the photoresist layer.

20 Claims, 11 Drawing Sheets

U.S. PATENT DOCUMENTS

| | | | |
|---|---|---|---|
| 7,838,351 B2 * | 11/2010 | Toyota et al. | 438/158 |
| 2003/0107326 A1 | 6/2003 | Park et al. | |
| 2003/0134458 A1 * | 7/2003 | Shih | 438/149 |
| 2004/0125263 A1 | 7/2004 | Lee | |
| 2005/0029516 A1 * | 2/2005 | Lai | 257/59 |
| 2006/0033106 A1 * | 2/2006 | Seo et al. | 257/66 |
| 2006/0170067 A1 * | 8/2006 | Maekawa et al. | 257/401 |
| 2007/0037070 A1 | 2/2007 | Ohnuma et al. | |
| 2007/0093004 A1 | 4/2007 | Park et al. | |
| 2007/0267641 A1 | 11/2007 | Seo | |
| 2008/0073653 A1 | 3/2008 | Iwasaki | |
| 2008/0258141 A1 * | 10/2008 | Park et al. | 257/43 |
| 2008/0308804 A1 * | 12/2008 | Akimoto et al. | 257/59 |
| 2008/0308806 A1 * | 12/2008 | Akimoto et al. | 257/59 |
| 2009/0008639 A1 * | 1/2009 | Akimoto et al. | 257/43 |

OTHER PUBLICATIONS

"Office Action of Taiwan Counterpart Application", issued on Aug. 26, 2011, p1-p4, in which the listed references were cited.

Navamathavan et al., "Effects of Electrical Bias Stress on the Performance of ZnO-Based TFTs Fabricated by RF Magnetron Sputtering", Journal of the Electrochemical Society, 153 (5), Mar. 9, 2006, 385-388.

* cited by examiner

METHOD FOR FABRICATING THIN FILM TRANSISTOR

CROSS-REFERENCE TO RELATED APPLICATION

This application claims the priority benefit of Taiwan application serial no. 97121565, filed on Jun. 10, 2008. The entirety of the above-mentioned patent application is hereby incorporated by reference herein and made a part of this specification.

BACKGROUND OF THE INVENTION

1. Field of the Invention

The present invention generally relates to a method for fabricating a thin film transistor (TFT), in particular, to a method for fabricating a TFT using a metal oxide as an active layer.

2. Description of Related Art

In recent years, due to the progress of the semiconductor process technology, TFTs are fabricated more easily and quickly. The TFTs are widely applied to computer chips, mobile phone chips, TFT liquid crystal displays (TFT LCDs), or other electronic products. For example, for the TFT LCDs, the TFTs are used as charging or discharging switches of a storage capacitor.

Generally speaking, according to material of the active layer, the TFT may be divided into amorphous silicon TFT and polycrystalline silicon TFT. However, in response to the increasing demands for the LCDs in the market, more efforts are put into the research and development of new TFT technique. The TFTs adopting the metal oxide, for example, ZnO, as the active layer have been developed, and the electrical characteristics thereof catch up with the amorphous silicon TFTs, and the element representation is good.

However, for example, for the TFT using ZnO as the active layer, in the subsequent process of forming a source and a drain, ZnO is easily damaged by, for example, plasma, etchant, stripper, and other materials, such that the active layer of the thin film characteristics would be changed, thereby influencing the element characteristics of the TFTs.

SUMMARY OF THE INVENTION

Accordingly, the present invention is directed to a method for fabricating a TFT, in which a photoresist layer is covered on a metal oxide active layer, so as to protect the metal oxide active layer.

The present invention is further directed to a method for fabricating a TFT, in which an insulating layer is covered on a metal oxide active layer, so as to protect the metal oxide active layer.

The present invention is still directed to a method for fabricating a TFT, in which a protective layer is covered on a metal oxide active layer, so as to protect the metal oxide active layer.

The present invention provides a method for fabricating a TFT, which includes the following steps. First, a gate is formed on a substrate. A gate insulating layer is formed on the substrate to cover the gate. A metal oxide material layer is formed on the gate insulating layer. After that, a photoresist layer is formed on the metal oxide material layer, in which a thickness of the photoresist layer above the gate is larger than that of the photoresist layer above two sides adjacent to the gate. Then, a portion of the metal oxide material layer is removed to form a metal oxide active layer by using the photoresist layer as a mask. The photoresist layer above the two sides adjacent to the gate is removed while leaving the photoresist layer covered on a portion of the metal oxide active layer. Thereafter, a source and a drain are formed on the metal oxide active layer covered by the photoresist layer.

The present invention further provides a method for fabricating a TFT, which includes the following steps. First, a gate is formed on a substrate. A gate insulating layer is formed on the substrate to cover the gate. A metal oxide material layer is formed on the gate insulating layer. After that, an insulating material layer is formed on the metal oxide material layer. Next, a photoresist layer is formed on the metal oxide material layer, in which a thickness of the photoresist layer above the gate is larger than that of the photoresist layer above two sides adjacent to the gate. Then, a portion of the insulating material layer and a portion of the metal oxide material layer are removed to form an insulating layer and a metal oxide active layer by using the photoresist layer as a mask. The photoresist layer above the two sides adjacent to the gate is removed. Next, the insulating layer above the two sides adjacent to the gate is removed while leaving the insulating layer covered on a portion of the metal oxide active layer. Thereafter, a source and a drain are formed on the metal oxide active layer covered by the insulating layer.

The present invention still provides a method for fabricating a TFT, which includes the following steps. First, a gate is formed on a substrate. A gate insulating layer is formed on the substrate to cover the gate. Next, a metal oxide active layer is formed on the gate insulating layer above the gate. Then, a non-vacuum process is performed to form a protective layer on the metal oxide active layer. Thereafter, a source and a drain are formed on the metal oxide active layer covered by the protective layer.

The TFT formed by the method for fabricating a TFT of the present invention includes a photoresist layer, an insulating layer, or a protective layer covering the metal oxide active layer. Thus, the metal oxide active layer may be protected from being exposed to plasma, etchant, stripper, and other materials in the subsequent processes, so as to stabilize the thin film characteristics of the metal oxide active layer, thereby improving the element characteristics of the TFT.

In order to have a further understanding of the above and other objectives, features, and advantages of the present invention, a detailed description is given as follows with the embodiments and the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

The First Embodiment

FIGS. 1A to 1G are schematic cross-sectional views illustrating processes of a method for fabricating a TFT according to a first embodiment of the present invention.

Figure 1A:
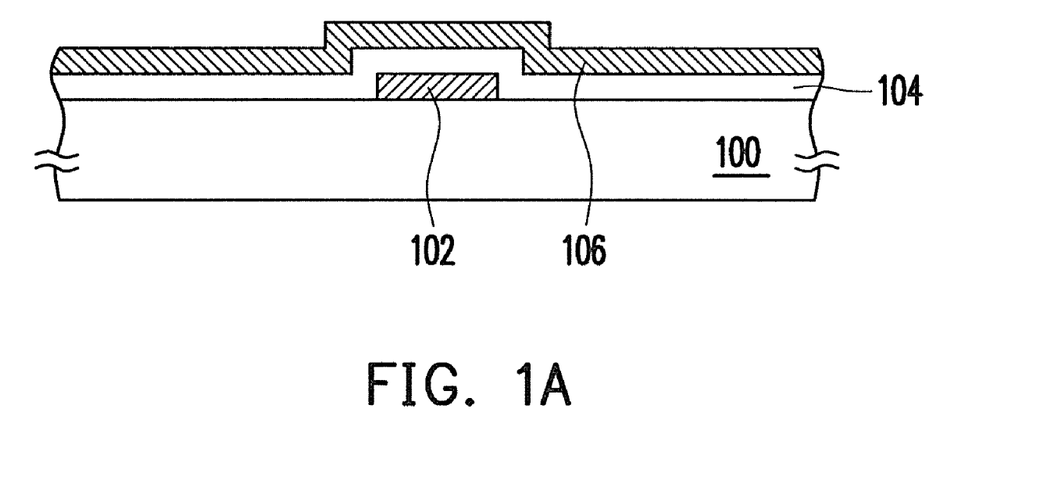
FIGS. 1A to 1G are schematic cross-sectional views illustrating processes of a method for fabricating a TFT according to a first embodiment of the present invention.

Referring to FIG. 1A, first, a gate 102 is formed on a substrate 100. The substrate 100 is, for example, a glass substrate, a quartz substrate, or other substrates. A material of the gate 102 is, for example, aluminum, chromium, tantalum, or other metal materials, and the forming method includes a thin film deposition process, a photolithography process, and an etching process. The thin film deposition process may be sputtering, electroplating, spin coating, printing, electroless plating, or other appropriate methods.

Then, a gate insulating layer 104 is formed on the substrate 100 to cover the gate 102. A material of the gate insulating layer 104 is, for example, silicon dioxide, silicon nitride, silicon oxynitride, or other dielectric materials, and the forming method is, for example, chemical vapor deposition (CVD).

Next, a metal oxide material layer 106 is formed on the gate insulating layer 104. A material of the metal oxide material layer 106 includes a group II-VI compound, for example ZnO, and the forming method is, for example, a non-vacuum process. The non-vacuum process is the process performed in a non-vacuum chamber, for example, spin-coating, inject-printing, drop printing, casting, micro-stamping, screen-printing, imprinting, and other methods. In an embodiment, the method for forming the metal oxide material layer may also be a vacuum process, which is the process performed in a vacuum chamber, for example, a physical vapor deposition (PVD) process or a CVD process. Furthermore, in an embodiment, the metal oxide material layer 106 may be formed by the group II-VI compound doped with the elements selected from anyone of group of alkaline earth metal, group IIIA, group VA, group VIA, or transition metals. For example, a material of the metal oxide material layer 106 may be InZnO or GaInZnO.

Figure 1B:
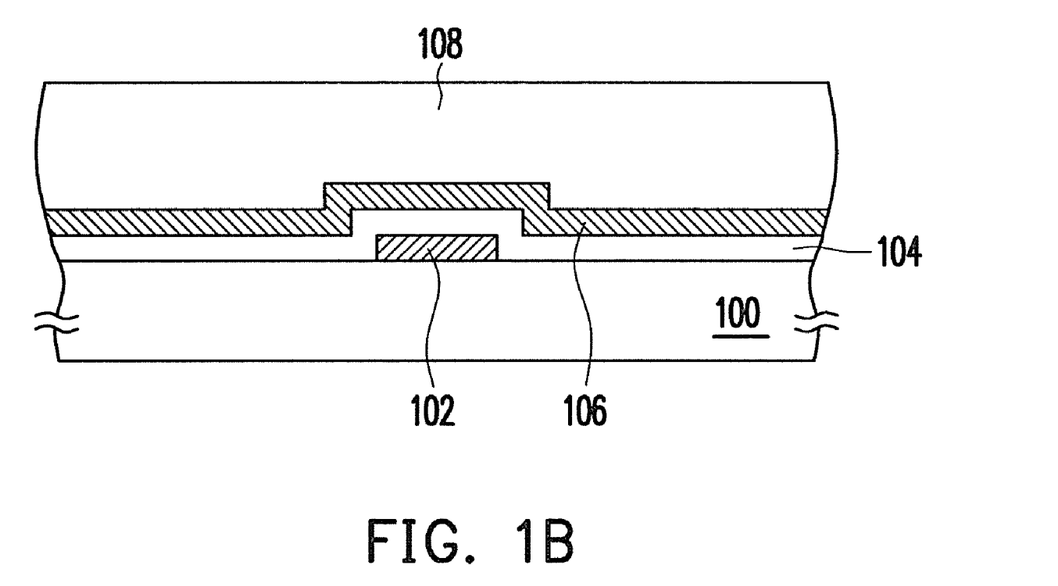

Referring to FIG. 1B, then, a photosensitive material layer 108 having a uniform thickness is formed on the metal oxide material layer 106. The method for forming the photosensitive material layer 108 is, for example, a spin-coating process together with a post-baking step.

Figure 1C:
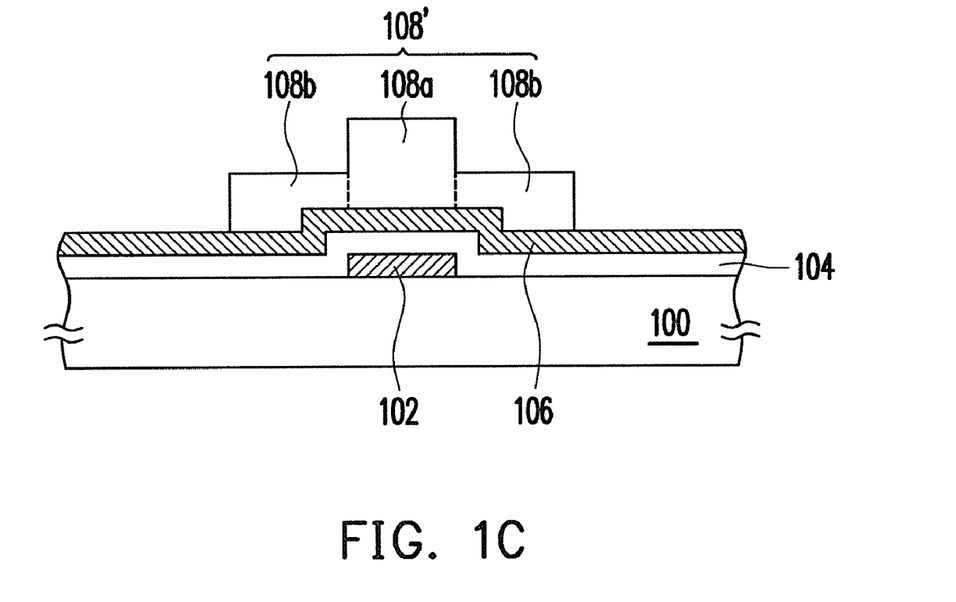

Referring to FIG. 1C, thereafter, an exposure process and a development process are performed on the photosensitive material layer 108, so as to form a photoresist layer 108' having a different heights. A thickness of the photoresist layer 108a above the gate 102 is larger than that of the photoresist layer 108b above two sides adjacent to the gate 102. In the exposure process, for example, a halftone mask (not shown) is used.

Figure 1D:
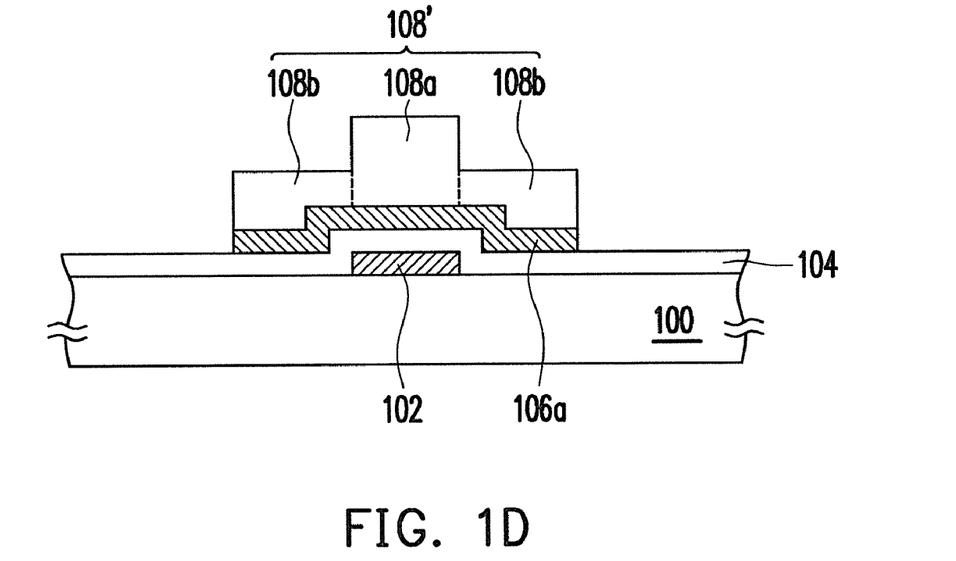

Referring to FIG. 1D, thereafter, a portion of the metal oxide material layer 106 is removed to form a metal oxide active layer 106a by using the photoresist layer 108' as a mask. The method for removing the portion of the metal oxide material layer 106 includes a wet-etching process or a dry-etching process.

Figure 1E:
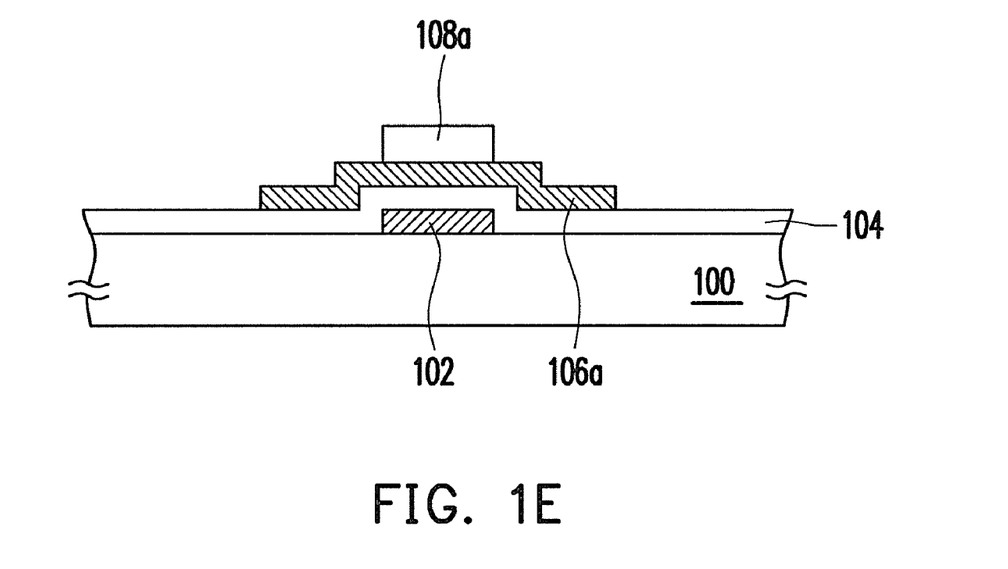

Referring to FIG. 1E, then, the photoresist layer 108b above the two sides adjacent to the gate 102 and having a thinner thickness is removed, while leaving the photoresist layer 108a covered on a portion of the metal oxide active layer 106a. The method for removing the photoresist layer 108b is, for example, a plasma etching process. In detail, a reactant gas including oxygen, hydrogen, nitrogen, ammonia gas, or other gases may be dissociated to reactive ions by the plasma, so as to perform an anisotropic etching on the photoresist layer 108'. The photoresist layer 108b having the thinner thickness may be totally removed, and the metal oxide active layer 106a above the two sides adjacent to the gate 102 is exposed. After a portion of the photoresist layer 108a having a thicker thickness is removed, the photoresist layer 108a still covers the metal oxide active layer 106a above the gate 102.

Figure 1F:
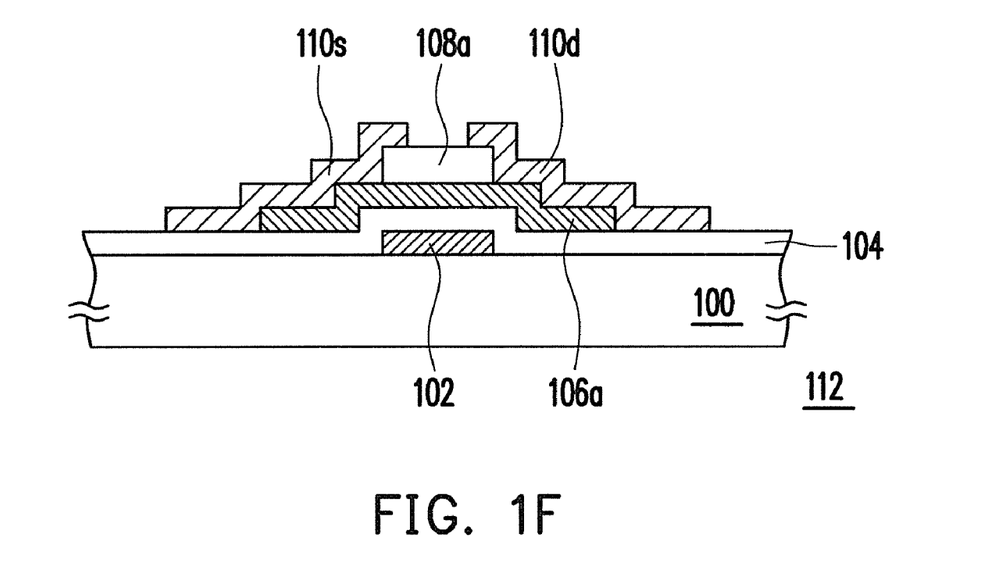

Referring to FIG. 1F, thereafter, a source 110s and a drain 110d are formed on the metal oxide active layer 106a covered by the photoresist layer 108a, so as to form a TFT 112. A material of the source 110s and the drain 110d is, for example, aluminum, chromium, tantalum, or other metal materials, and the forming method includes the thin film deposition process, the photolithography process, the etching process, and other processes. The etching process is, for example, a dry-etching process using the plasma or a wet-etching process using an etchant. It should be noted that the metal oxide active layer 106a is covered by the photoresist layer 108a, so the metal oxide active layer 106a will not be exposed in the plasma, the etchant, the stripper, or other materials, and is protected from being damaged by the above substances. Further, in the step of removing the photoresist layer 108 having the thinner thickness by the plasma etching process, the metal oxide active layer 106a exposed above the two sides adjacent to the gate 102 is in contact with the plasma, and thus has a smaller resistance, such that a contact resistance between the metal oxide active layer 106a and the source 110s and between the metal oxide active layer 106a the drain 110d may be reduced.

Figure 1G:
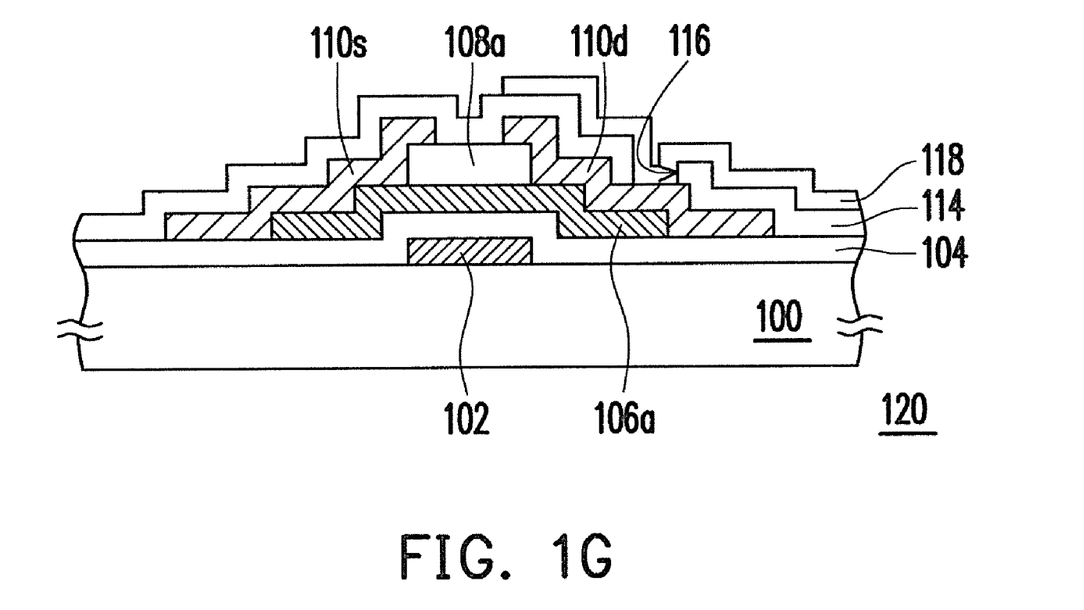

Referring to FIG. 1G, in this embodiment, the TFT 112 is, for example, used as a switching device in the TFT LCD. Therefore, the subsequent process further includes forming a dielectric layer 114 having a contact 116 on the substrate 100 and forming a pixel electrode 118 electrically connected to the drain 110d on the dielectric layer 114, so as to form a pixel structure 120. A material of the dielectric layer 114 is, for example, silicon nitride, and the forming method is, for example, plasma CVD. A material of the pixel electrode 118 is, for example, ITO, IZO, ZnO, or other metal oxide or organic materials, and the forming method includes sputtering, electroplating, spin coating, printing, electroless plating, or other appropriate methods.

In this embodiment, the metal oxide active layer 106a is covered by the photoresist layer 108a, so in the process of forming the source 110s or the drain 110d or forming the dielectric layer 114, the metal oxide active layer 106a will not be exposed in the plasma, the etchant, the stripper, or other materials, such that the metal oxide active layer 106a has stable thin film characteristics, thereby improving the element characteristics of the TFT 112 and the pixel structure 120. Further, the photoresist layer 108b is removed to achieve a smaller contact resistance between the metal oxide active layer 106a and the source 110s and between the metal oxide active layer 106a and the drain 110d, thereby improving electrical performance of the TFT 112. Therefore, the LCD adopting the TFT as the driving device has advantages of good display quality, stable electrical property, and so on.

The Second Embodiment

FIGS. 2A to 2G are schematic cross-sectional views illustrating processes of a method for fabricating the TFT according to a second embodiment of the present invention. In this embodiment, the forepart of the process of fabricating the TFT is similar to that of the first embodiment with reference to FIG. 1A and the corresponding illustrations, and the details will not be described herein again.

Figure 2A:
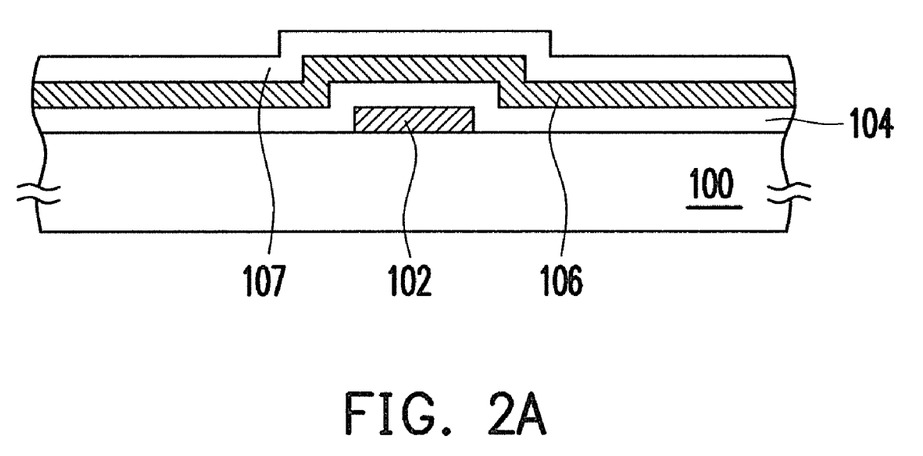
FIGS. 2A to 2G are schematic cross-sectional views illustrating processes of a method for fabricating the TFT according to a second embodiment of the present invention.

Referring to FIG. 2A, a gate 102, a gate insulating layer 104, and a metal oxide material layer 106 are already formed on a substrate 100. First, an insulating material layer 107 is formed on the metal oxide material layer 106. A material of the insulating material layer 107 includes an inorganic insulating material or an organic insulating material. The inorganic insulating material is, for example, silicon dioxide, silicon nitride, or other materials, the organic insulating material is, for example, polymethyl methacrylate (PMMA), polyvinyl phenol (PVP), or other materials, and the forming method is, for example, CVD.

Figure 2B:
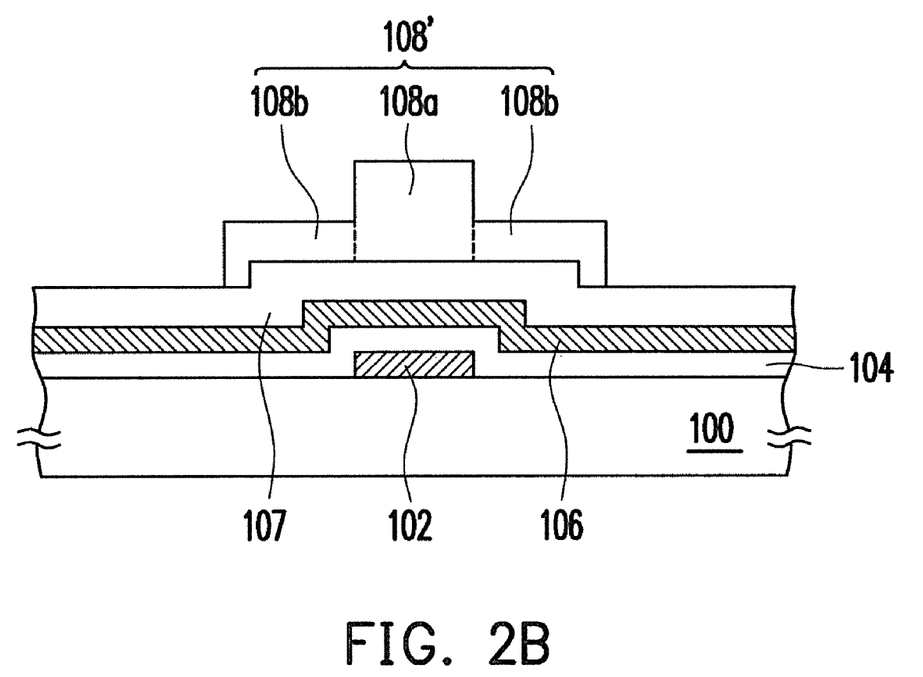

Referring to FIG. 2B, then, a photoresist layer 108' is formed on the insulating material layer 107. A thickness of the photoresist layer 108a above the gate 102 is larger than that of the photoresist layer 108b above two sides adjacent to the gate 102. In this embodiment, the photoresist layer 108' having a different heights is formed by, for example, first forming a photosensitive material layer (not shown) having a uniform thickness on the substrate 100, and performing the exposure process and the development process on the photosensitive material layer. In the exposure process, for example, the halftone mask (not shown) is used.

Figure 2C:
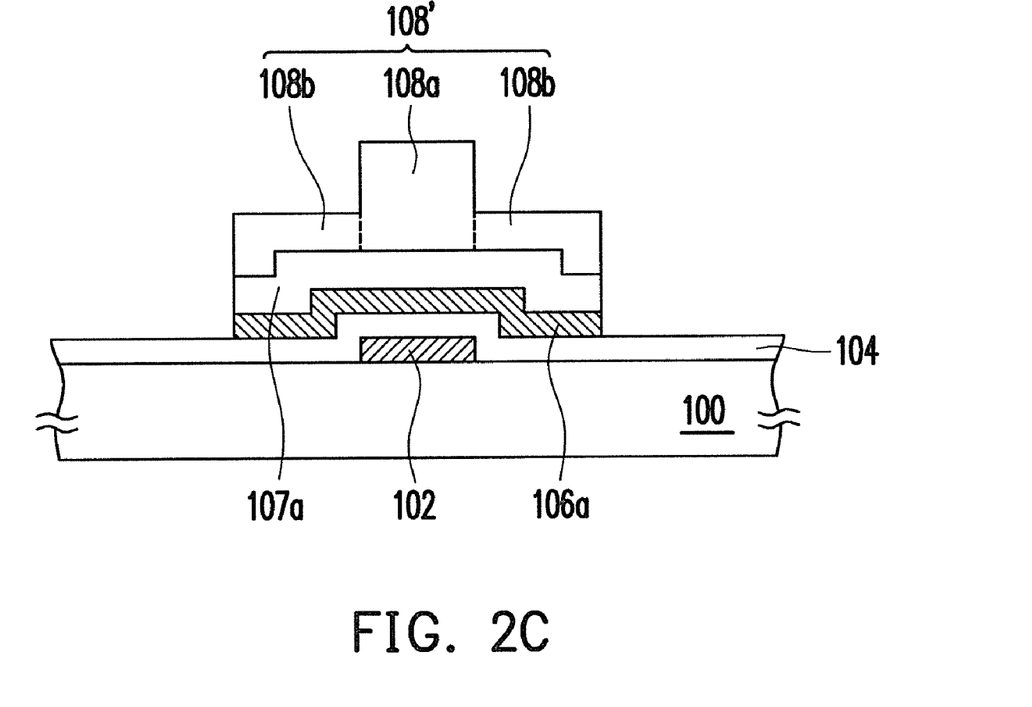

Referring to FIG. 2C, next, a portion of the metal oxide material layer 106 and a portion of the insulating material 107 are removed to form a metal oxide active layer 106a and an insulating layer 107a by using the photoresist layer 108' as a mask. The method for removing the portion of the metal oxide material layer 106 and the portion of the insulating material 107 includes a wet-etching process or a dry-etching process.

Figure 2D:
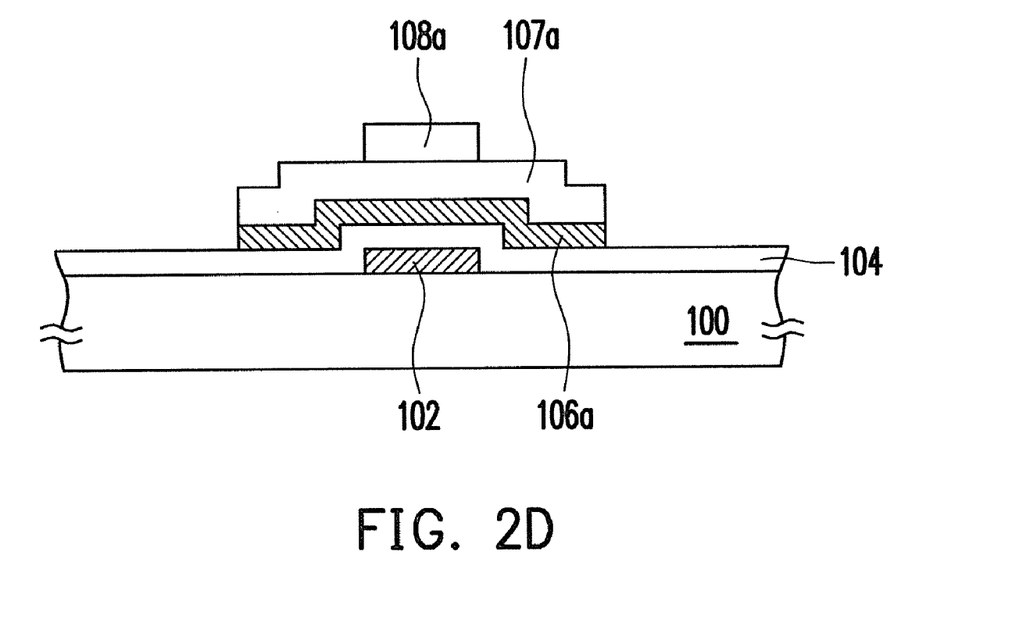

Referring to FIG. 2D, thereafter, the photoresist layer 108b above the two sides adjacent to the gate 102 is removed while leaving the photoresist layer 108a covered on the metal oxide active layer 106a. The method for removing the photoresist layer 108b is, for example, a plasma etching process with reference to the first embodiment, and the details will not be described herein again.

Figure 2E:
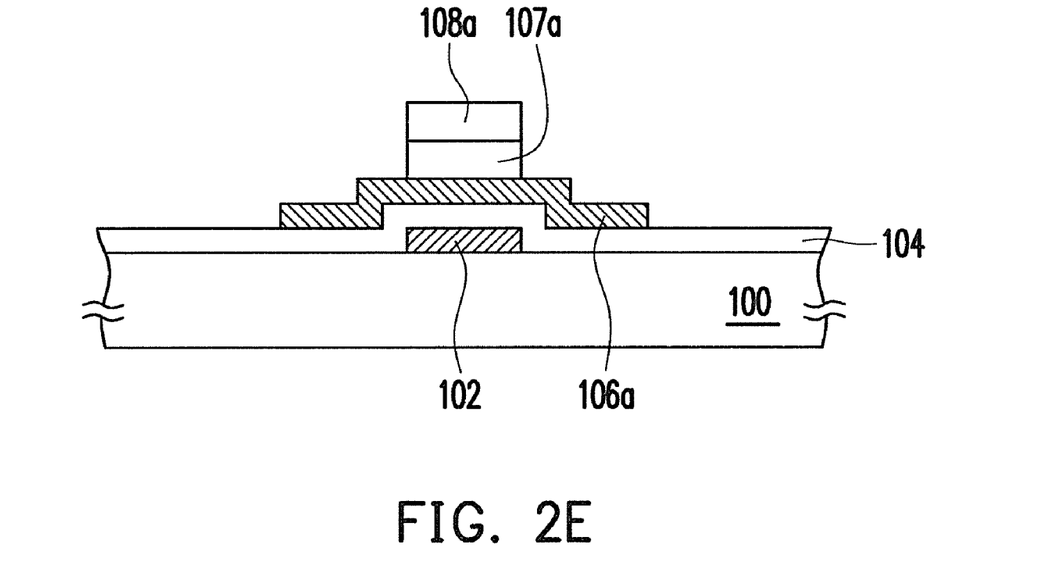

Referring to FIG. 2E, next, for example, the insulating layer 107a above the two sides adjacent to the gate 102 is removed by using the photoresist layer 108a as a mask layer. The method for removing the portion of the insulating layer 107a is, for example, a dry-etching process.

Figure 2F:
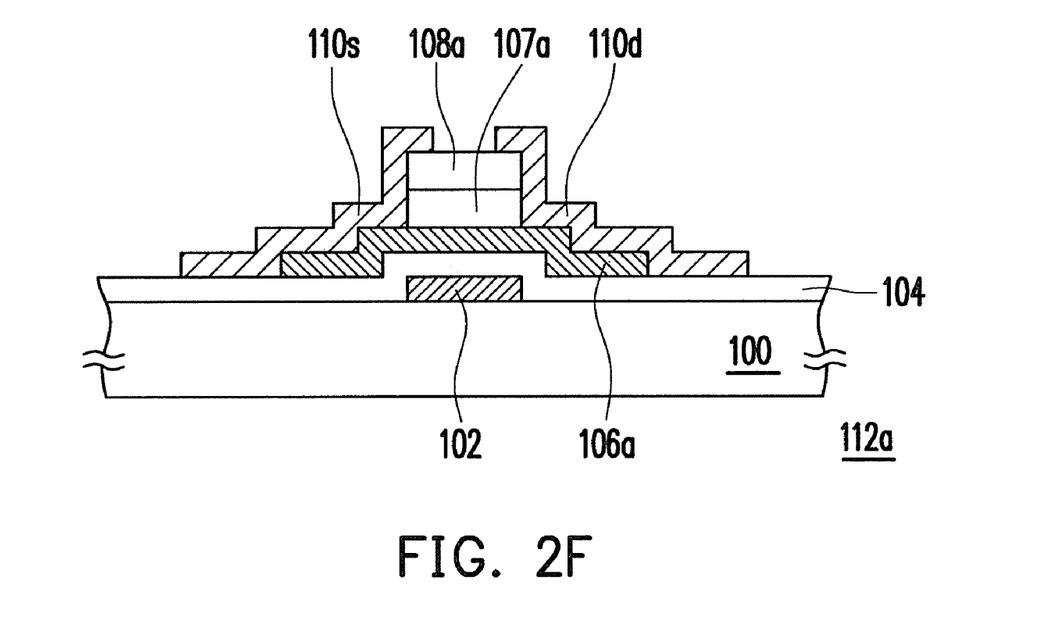

Referring to FIG. 2F, then, a source 110s and a drain 110d are formed on the metal oxide active layer 106a covered by the insulating layer 107a and the photoresist layer 108a, so as to form a TFT 112a. A material of the source 110s and the drain 110d is, for example, aluminum, chromium, tantalum, or other metal materials, and the forming method includes a thin film deposition process, a photolithography process, an etching process, and other processes. The etching process is, for example, a dry-etching process using the plasma or a wet-etching process using an etchant.

Figure 2G:
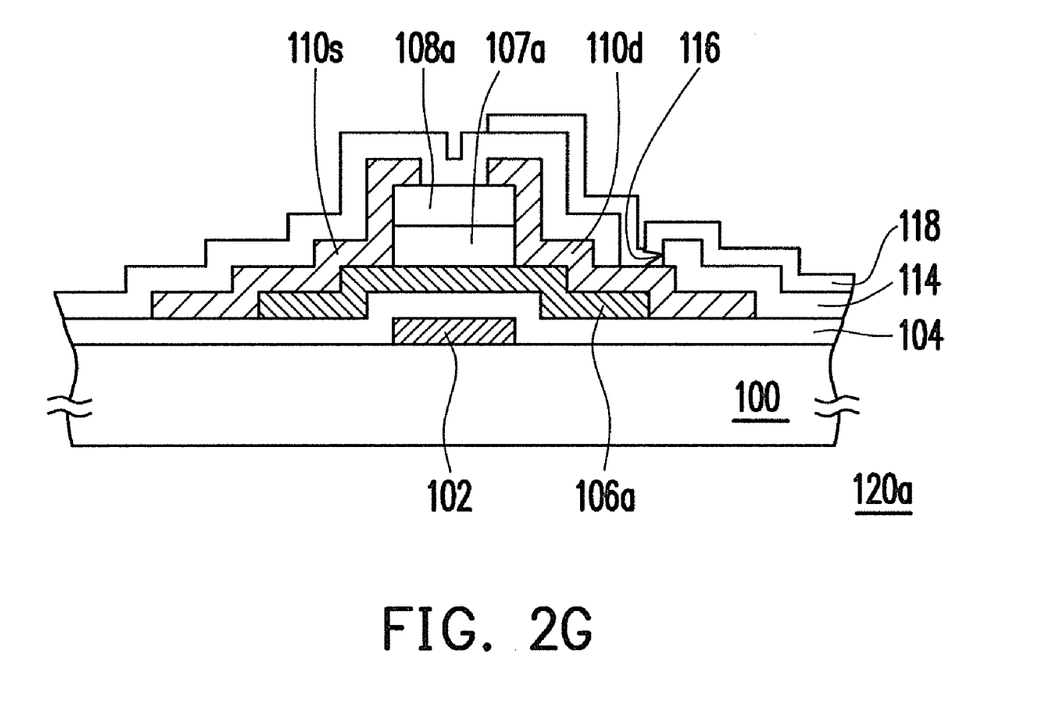

Referring to FIG. 2G, in this embodiment, the TFT 112a is, for example, used as a switching device in the TFT LCD. Therefore, the subsequent process further includes forming a dielectric layer 114 having a contact 116 on the substrate 100 and forming a pixel electrode 118 electrically connected to the drain 110d on the dielectric layer 114, so as to form a pixel structure 120a. The materials and forming methods of the dielectric layer 114 and the pixel electrode 118 are similar to the first embodiment, and the details will not be described herein again.

Figure 3A:
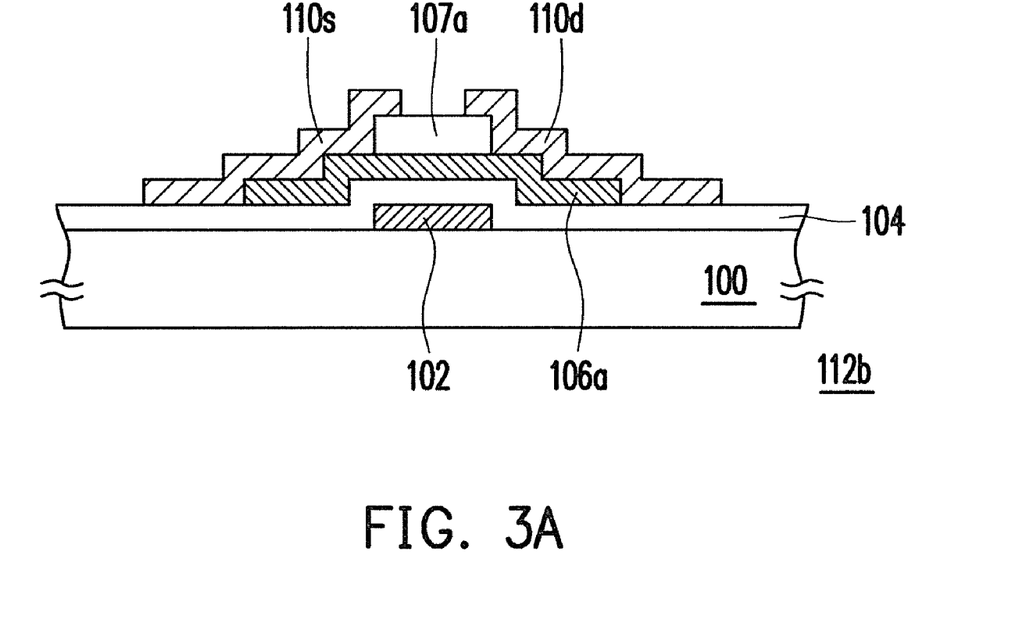
FIG. 3A is a schematic cross-sectional view of a TFT according to another embodiment of the present invention.
Figure 3B:
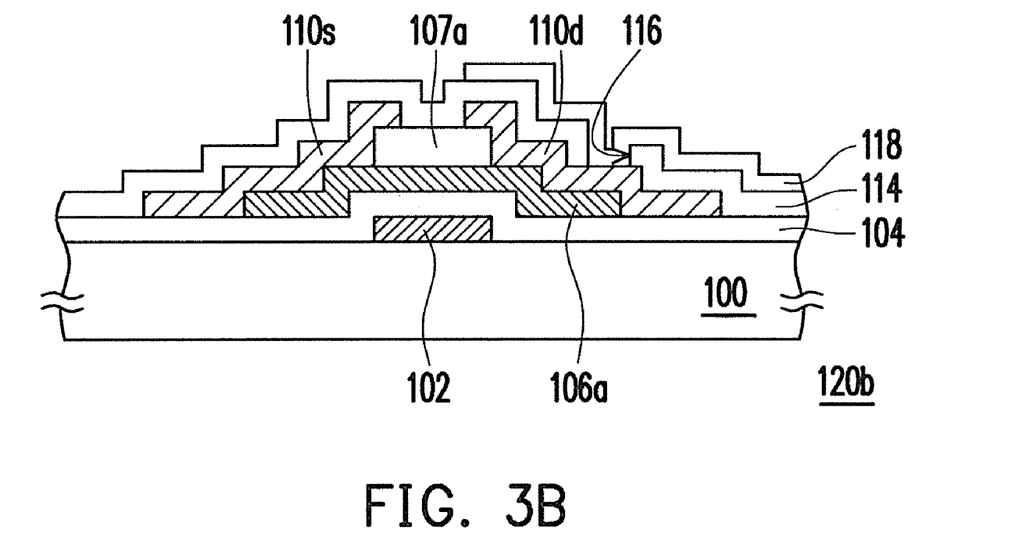
FIG. 3B is a schematic cross-sectional view of a pixel structure including the TFT as shown in FIG. 3A.

In this embodiment, for example, the metal oxide active layer 106a is protected by the photoresist layer 108a and the insulating layer 107a. However, referring to FIGS. 3A and 3B together, in another embodiment, the TFT 112b and the pixel structure 120b only include an insulating layer 107a for protecting the metal oxide active layer 106a. In other words, after the step of removing the insulating layer 107a above the two sides adjacent to the gate 102, the method further includes a step of removing the photoresist layer 108a, such that only the metal oxide active layer 106a is covered by the insulating layer 107a. Thereafter, the source 110s and the drain 110d are formed on the metal oxide active layer 106a covered by the insulating layer 107a, so as to form a TFT 112b. Thereafter, the dielectric layer 114 having the contact 116 is formed on the substrate 100 and the pixel electrode 118 electrically connected to the drain 110d is formed on the dielectric layer 114, so as to form a pixel structure 120b.

In the above embodiment, the TFT has the photoresist layer or the insulating layer for protecting the metal oxide active layer, so as to prevent the metal oxide active layer from exposing in the plasma, the etchant, the stripper, and other materials. Thus, the metal oxide active layer has stable thin film characteristics, and the element characteristics of the TFT and the pixel structure are improved. Therefore, the LCD adopting the TFT as the driving device has advantages of good display quality, stable electrical property, and so on.

The Third Embodiment

FIGS. 4A to 4D are schematic cross-sectional views illustrating processes of a method for fabricating the TFT according to a third embodiment of the present invention.

Figure 4A:
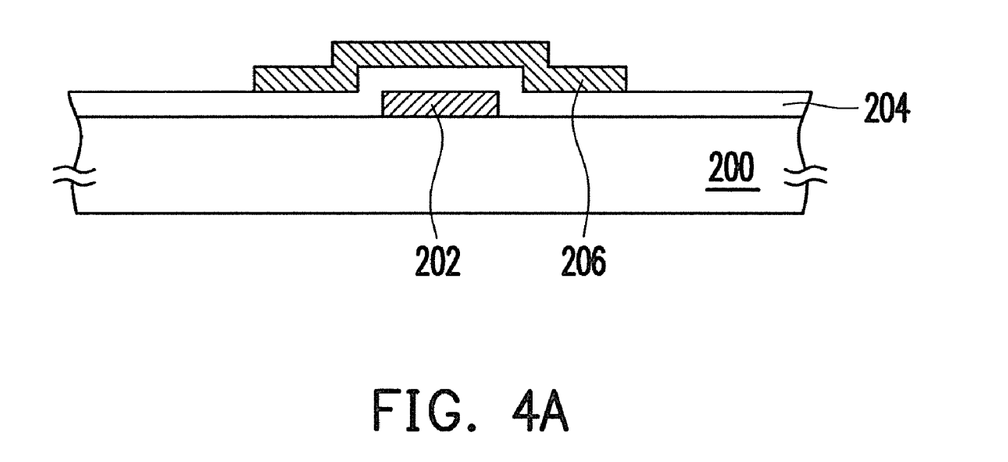
FIGS. 4A to 4D are schematic cross-sectional views illustrating processes of a method for fabricating the TFT according to a third embodiment of the present invention.

Referring to FIG. 4A, first, a gate 202 and a gate insulating layer 204 are formed in sequence on a substrate 200. The materials and forming methods of the gate 202 and the gate insulating layer 204 are similar to the first embodiment, and the details will not be described herein again.

Then, a metal oxide active layer 206 is formed on the gate insulating layer 204 above the gate 202. A material of the metal oxide active layer 206 includes a group II-VI compound, for example, ZnO, and the forming method is, for example, a non-vacuum process, which is the process performed in a non-vacuum chamber, for example, spin-coating, inject-printing, drop printing, casting, micro-stamping, screen-printing, imprinting, and other methods. In an embodiment, the method for forming the metal oxide material layer may also be a vacuum process, which is the process performed in a vacuum chamber, for example, a physical vapor deposition process or a CVD process. Further, in an embodiment, the metal oxide material layer 206 may also be formed by the group II-VI compound doped with the elements selected from anyone of group of alkaline earth metal, group IIIA, group VA, group VIA, or transition metals. For example, a material of the metal oxide material layer 206 may be InZnO or GaInZnO.

Figure 4B:
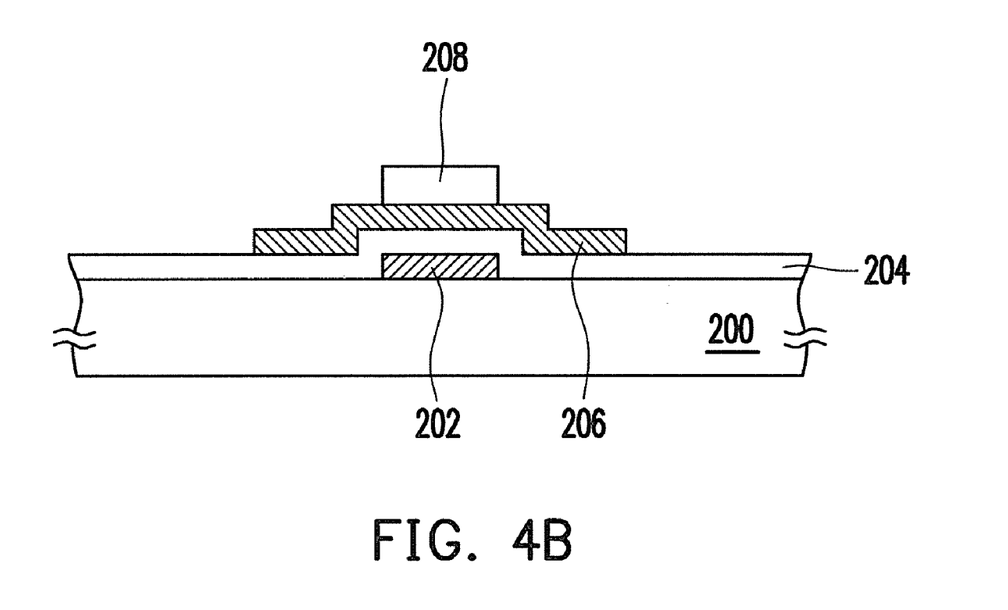

Referring to FIG. 4B, next, a non-vacuum process is performed, so as to form a protective layer 208 on the metal oxide active layer 206. The non-vacuum process is the process performed in a non-vacuum chamber, for example, spin-coating, inject-printing, screen-printing, or other methods. A material of the protective layer 208 includes a photosensitive material or a non-photosensitive material. The non-photosensitive material includes an inorganic material or an organic material, the inorganic material is, for example, silicon dioxide, silicon nitride, or other materials, and the organic material is, for example, PMMA, PVP, or other materials.

Figure 4C:
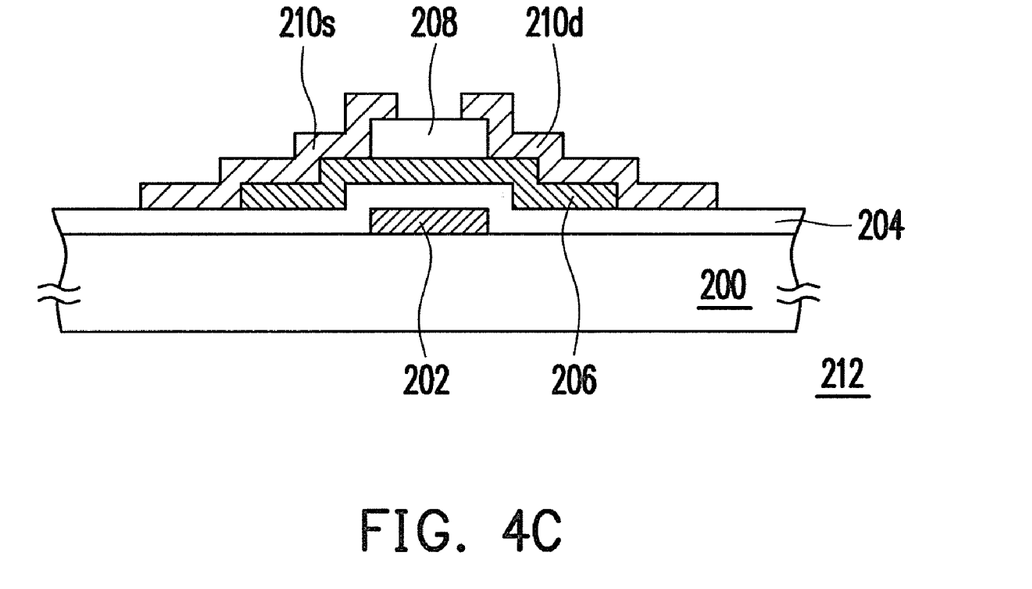

Referring to FIG. 4C, thereafter, a source 210s and a drain 210d are formed on the metal oxide active layer 206 covered by the protective layer 208, so as to form a TFT 212. A material of the source 210s and the drain 210d is, for example, aluminum, chromium, tantalum, or other metal materials, and the forming method includes a thin film deposition process, a photolithography process, an etching process, and other processes. The etching process is, for example, a dry-etching process using a plasma or a wet-etching process using an etchant.

Figure 4D:
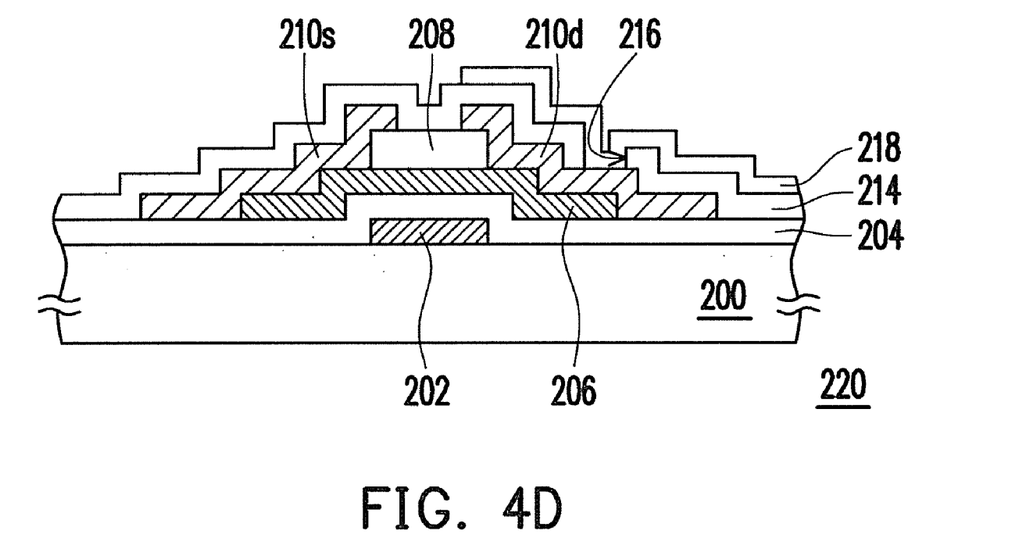

Referring to FIG. 4D, in this embodiment, the TFT 212 is, for example, used as a switching device in the TFT LCD. Therefore, the subsequent process further includes forming a dielectric layer 214 having a contact 216 on the substrate 200 and forming a pixel electrode 218 electrically connected to the drain 210d on the dielectric layer 214, so as to form a pixel structure 220. The materials and the forming methods of the dielectric layer 214 and the pixel electrode 218 are similar to the first embodiment, and the details will not be described herein again.

In this embodiment, the protective layer 208 is formed through the non-vacuum process. As compared with deposition and other vacuum processes, the non-vacuum process may alleviate the damage on the metal oxide active layer, and further stabilize the thin film characteristics of the metal oxide active layer. In addition, the protective layer may protect the metal oxide active layer from contacting with the plasma, the etchant, the stripper, and other materials, thereby improving the element characteristics of the TFT and the pixel structure. Therefore, the LCD adopting the TFT as the driving device has advantages of good display quality, stable electrical property, and so on.

To sum up, the TFT adopts the metal oxide as the metal oxide active layer, and has the photoresist layer, the insulating layer, or the protective layer for protecting metal oxide active layer. Therefore, the metal oxide active layer is protected from being exposed in the plasma, the etchant, the stripper, or other materials. Therefore, the method for fabricating the TFT may improve the element characteristics of the TFT and the pixel structure adopting the TFT. In addition, in method for fabricating the TFT, the contact resistance between the metal oxide active layer and the source and between the metal oxide active layer the drain may be reduced, thereby improving the electrical performance of the TFT. Further, the photoresist layer having the different heights is formed by using the halftone mask, and the photoresist layer is used as the mask for forming the metal oxide active layer, thereby reducing the number of the masks used in the process of fabricating the TFT and reducing the production cost of the TFT. Therefore, the LCD adopting the TFT as the driving device has advantages of good display quality, stable electrical property, and low production cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a thin film transistor (TFT), comprising:
    forming a gate on a substrate;
    forming a gate insulating layer on the substrate to cover the gate;
    forming a metal oxide material layer on the gate insulating layer;
    forming a photoresist layer on the metal oxide material layer, wherein a thickness of the photoresist layer above the gate is larger than that of the photoresist layer above two sides adjacent to the gate;
    removing a portion of the metal oxide material layer to form a metal oxide active layer by using the photoresist layer as a mask;
    removing the photoresist layer above the two sides adjacent to the gate while leaving the photoresist layer covered on a portion of the metal oxide active layer; and
    forming a source and a drain on the metal oxide active layer covered by the photoresist layer.

2. The method for fabricating a TFT according to claim 1, wherein the process for forming the photoresist layer comprises:
    forming a photosensitive material layer on the metal oxide material layer;
    performing an exposure process on the photosensitive material layer by using a halftone mask; and
    performing a development process.

3. The method for fabricating a TFT according to claim 1, wherein a material of the metal oxide material layer comprises a group II-VI compound.

4. The method for fabricating a TFT according to claim 3, wherein the metal oxide material layer is further doped with one or more elements selected from anyone of group of alkaline earth metal, group IIIA, group VA, group VIA, or transition metals.

5. A method for fabricating a TFT, comprising:
    forming a gate on a substrate;
    forming a gate insulating layer on the substrate to cover the gate;
    forming a metal oxide material layer on the gate insulating layer;
    forming an insulating material layer on the metal oxide material layer;
    forming a photoresist layer on the insulating material layer, wherein a thickness of the photoresist layer above the gate is larger than that of the photoresist layer above two sides adjacent to the gate;
    removing a portion of the insulating material layer and a portion of the metal oxide material layer to form an insulating layer and a metal oxide active layer by using the photoresist layer as a mask;
    removing the photoresist layer above the two sides adjacent to the gate;
    removing the insulating layer above the two sides adjacent to the gate while leaving the insulating layer covered on a portion of the metal oxide active layer; and
    forming a source and a drain on the metal oxide active layer covered by the insulating layer.

6. The method for fabricating a TFT according to claim 5, wherein the process for forming the photoresist layer comprises:
    forming a photosensitive material layer on the metal oxide material layer;
    performing an exposure process on the photosensitive material layer by using a halftone mask; and
    performing a development process.

7. The method for fabricating a TFT according to claim 5, wherein a material of the metal oxide material layer comprises a group II-VI compound.

8. The method for fabricating a TFT according to claim 7, wherein the metal oxide material layer is further doped with one or more elements selected from anyone of group of alkaline earth metal, group IIIA, group VA, group VIA, or transition metals.

9. The method for fabricating a TFT according to claim 5, wherein a material of the insulating material layer comprises an inorganic insulating material or an organic insulating material.

10. The method for fabricating a TFT according to claim 9, wherein the inorganic insulating material comprises silicon oxide or silicon nitride.

11. The method for fabricating a TFT according to claim 9, wherein the organic insulating material comprises polymethyl methacrylate (PMMA) or polyvinyl phenol (PVP).

12. The method for fabricating a TFT according to claim 5, further comprising removing the photoresist layer above the gate.

13. A method for fabricating a TFT, comprising:
   forming a gate on a substrate;
   forming a gate insulating layer on the substrate to cover the gate;
   forming a metal oxide active layer on the gate insulating layer above the gate and above two sides adjacent to the gate;
   performing a non-vacuum process to form a protective layer on the metal oxide active layer; and
   forming a source and a drain on the metal oxide active layer covered by the protective layer.

14. The method for fabricating a TFT according to claim 13, wherein the non-vacuum process comprises spin-coating, inject-printing, or screen-printing.

15. The method for fabricating a TFT according to claim 13, wherein a material of the metal oxide material layer comprises a group II-VI compound.

16. The method for fabricating a TFT according to claim 15, wherein the metal oxide active layer is further doped with one or more elements selected from anyone of group of alkaline earth metal, group IIIA, group VA, group VIA, or transition metals.

17. The method for fabricating a TFT according to claim 13, wherein a material of the protective layer comprises a photosensitive material or a non-photosensitive material.

18. The method for fabricating a TFT according to claim 17, wherein the non-photosensitive material comprises an inorganic material or an organic material.

19. The method for fabricating a TFT according to claim 18, wherein the inorganic material comprises silicon oxide or silicon nitride.

20. The method for fabricating a TFT according to claim 18, wherein the organic material comprises PMMA or PVP.

* * * * *